(12) United States Patent
Okamoto et al.

(10) Patent No.: US 10,641,797 B2
(45) Date of Patent: May 5, 2020

(54) ELECTRIC POWER DEVICE AND METHOD OF PRODUCING THE ELECTRIC POWER DEVICE

(71) Applicant: HONDA MOTOR CO., LTD., Minato-ku, Tokyo (JP)

(72) Inventors: Noriaki Okamoto, Wako (JP); Masahiro Shimada, Wako (JP); Naoto Kochi, Wako (JP); Satoshi Hashino, Wako (JP); Satoru Fujita, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/992,331

(22) Filed: May 30, 2018

(65) Prior Publication Data

US 2018/0348262 A1 Dec. 6, 2018

(30) Foreign Application Priority Data

May 31, 2017 (JP) ................................. 2017-108840

(51) Int. Cl.
| | |
|---|---|
| *G01R 15/20* | (2006.01) |
| *G01R 19/15* | (2006.01) |
| *G01R 31/42* | (2006.01) |
| *G01R 19/25* | (2006.01) |

(52) U.S. Cl.
CPC ......... *G01R 15/202* (2013.01); *G01R 15/207* (2013.01); *G01R 19/15* (2013.01); *G01R 19/2513* (2013.01); *G01R 31/42* (2013.01)

(58) Field of Classification Search
CPC ............... G01R 15/202; G01R 15/207; G01R 19/2513; G01R 19/15; G01R 31/42; H02M 2001/0009; H02M 7/48

USPC .......................................................... 324/117
See application file for complete search history.

(56) References Cited

U.S. PATENT DOCUMENTS

| | | | | |
|---|---|---|---|---|
| 3,813,658 A | * | 5/1974 | Rich, Jr. ............... | B61L 25/043 235/449 |
| 4,112,347 A | * | 9/1978 | Moerman ................ | G05F 1/38 323/250 |
| 6,005,383 A | * | 12/1999 | Savary ................. | G01R 15/207 324/117 H |

(Continued)

FOREIGN PATENT DOCUMENTS

| | | |
|---|---|---|
| CN | 102193020 | 9/2011 |
| JP | 2014-006116 | 1/2014 |

(Continued)

OTHER PUBLICATIONS

Chinese Office Action and Search Report for Chinese Patent Application No. 201810552945.2 dated Nov. 28, 2019.

*Primary Examiner* — Christopher P McAndrew
(74) *Attorney, Agent, or Firm* — Amin, Turocy & Watson, LLP

(57) ABSTRACT

In an electric power device and a method of producing the electric power device, in an axial direction of a reactor, a distance between a detection element of a second electric current sensor and a central position of a winding part is shorter than a distance between a detection element of a first electric current sensor and a central position of a winding part. Further, a gap length of a core of the second electric current sensor is smaller than a gap length of a core of the first electric current sensor.

11 Claims, 9 Drawing Sheets

(56) References Cited

U.S. PATENT DOCUMENTS

| | | | | |
|---|---|---|---|---|
| 6,429,639 | B1* | 8/2002 | Pelly | G01R 27/402 324/117 H |
| 7,148,675 | B2* | 12/2006 | Itoh | G01R 15/202 324/117 R |
| 7,622,909 | B2* | 11/2009 | Teppan | G01R 33/04 324/117 H |
| 9,285,437 | B2* | 3/2016 | Rushmer | G01R 33/072 |
| 9,310,394 | B2* | 4/2016 | Okumura | G01R 3/00 |
| 9,455,084 | B2* | 9/2016 | Peck, Jr. | H01F 27/306 |
| 9,455,653 | B1* | 9/2016 | Garcha | G01R 15/202 |
| 2006/0062023 | A1* | 3/2006 | Patwardhan | H02M 7/757 363/15 |
| 2006/0226826 | A1* | 10/2006 | Teppan | G01R 15/202 324/117 H |
| 2009/0257212 | A1* | 10/2009 | Takano | H01L 25/071 361/784 |
| 2010/0131243 | A1* | 5/2010 | Park | G01R 19/2513 702/198 |
| 2011/0050222 | A1* | 3/2011 | Ueno | G01R 15/207 324/253 |
| 2013/0027021 | A1* | 1/2013 | Gokhale | G01R 15/183 324/117 R |
| 2013/0093253 | A1* | 4/2013 | Norconk | H02J 5/005 307/104 |
| 2013/0214593 | A1* | 8/2013 | Ohashi | B60R 16/03 307/10.1 |
| 2014/0070801 | A1* | 3/2014 | Tamura | G01R 15/207 324/244 |
| 2014/0077797 | A1* | 3/2014 | Nagao | G01R 19/15 324/253 |
| 2014/0176123 | A1* | 6/2014 | Okumura | G01R 15/202 324/127 |
| 2015/0160267 | A1* | 6/2015 | Juds | G01R 15/207 324/117 H |
| 2015/0219695 | A1* | 8/2015 | Zheng | H01F 27/402 324/72 |
| 2016/0011239 | A1* | 1/2016 | Yoon | G01R 33/07 324/126 |
| 2016/0146858 | A1* | 5/2016 | Miyakoshi | G01R 15/207 324/117 R |
| 2016/0204597 | A1* | 7/2016 | Hotta | H02M 7/537 318/139 |
| 2016/0223596 | A1* | 8/2016 | Meng | G01R 19/0092 |
| 2016/0226197 | A1* | 8/2016 | Spiegel | G01R 15/202 |
| 2016/0238668 | A1* | 8/2016 | Cordray | G01R 31/40 |
| 2016/0261213 | A1* | 9/2016 | Garcha | G01R 15/202 |
| 2017/0205471 | A1* | 7/2017 | Huang | G01R 1/08 |
| 2017/0276707 | A1* | 9/2017 | Ghislanzoni | G01R 15/183 |
| 2018/0348261 | A1* | 12/2018 | Okamoto | G01R 15/202 |
| 2018/0348262 | A1* | 12/2018 | Okamoto | G01R 15/202 |
| 2018/0350515 | A1* | 12/2018 | Okamoto | G01R 31/40 |

FOREIGN PATENT DOCUMENTS

| | | |
|---|---|---|
| JP | 2016-066720 | 4/2016 |
| JP | 2016-066744 | 4/2016 |

* cited by examiner

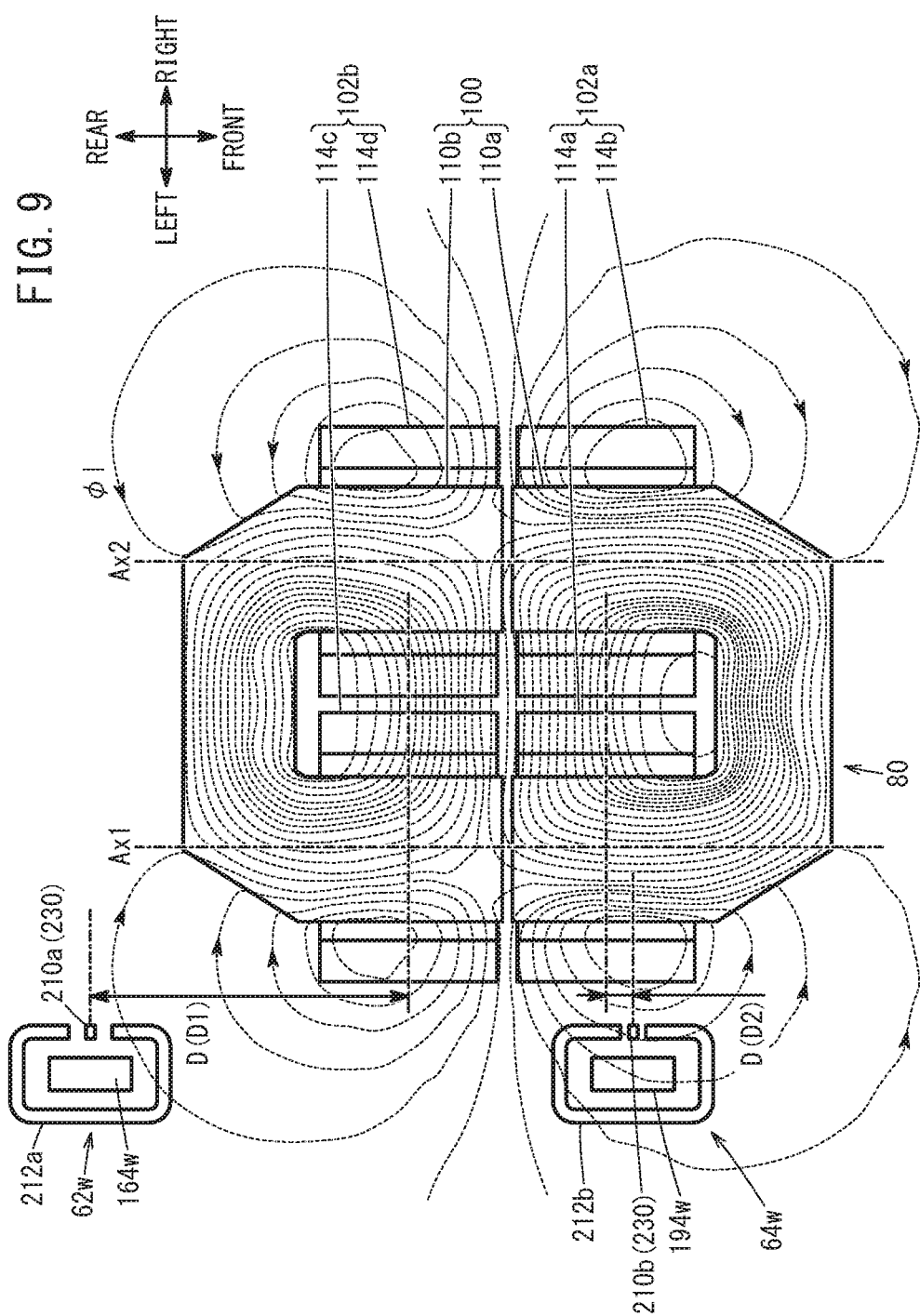

ELECTRIC POWER DEVICE AND METHOD OF PRODUCING THE ELECTRIC POWER DEVICE

CROSS-REFERENCE TO RELATED APPLICATION

This application is based upon and claims the benefit of priority from Japanese Patent Application No. 2017-108840 filed on May 31, 2017, the contents of which are incorporated herein by reference.

BACKGROUND OF THE INVENTION

Field of the Invention

The present invention relates to an electric power device including a plurality of electric current sensors and a method of producing the electric power device.

Description of the Related Art

Japanese Laid-Open Patent Publication No. 2014-006116 discloses an inverter including three bus bars for use of three-phase AC electric current output, and an additional fourth bus bar. An object of Japanese Laid-Open Patent Publication No. 2014-006116 is to reduce influence of leakage magnetic flux from electric current sensors of the output bus bars on an electric current sensor of the fourth bus bar (Abstract, paragraph [0009]).

In order to achieve the object, in the inverter disclosed in Japanese Laid-Open Patent Publication No. 2014-006116 (Abstract), the three output bus bars transmit output electric current in UVW three phases to a motor for driving the motor, and the three output bus bars and the fourth bus bar are arranged in parallel. Electric current sensors are provided for at least two of three output bus bars, and the fourth bus bar. Each of the electric current sensors includes a magnetic member having a C-shape around a bus bar, and a magnetosensitive element provided in a C-shaped gap of the magnetic member. Among the electric current sensors provided for the output bus bars, an electric current sensor 5a is remoter from an electric current sensor provided for the fourth bus bar, and an electric current sensor 5c is closer to the electric current sensor provided for the fourth bus bar. The gap length ga of the electric current sensor 5a is larger than the gap length gc of the electric current sensor 5c. It should be noted that the electric current sensor provided for the fourth bus bar is also referred to as the target electric current sensor (paragraph [0010]).

SUMMARY OF THE INVENTION

As described above, in Japanese Laid-Open Patent Publication No. 2014-006116, the gap length ga of the electric current sensor 5a which is remoter from the electric current sensor (target electric current sensor) provided for the fourth bus bar is larger than the gap length gc of the electric current sensor 5c which is closer to the electric current sensor provided for the fourth bus bar (Abstract). Stated otherwise, in Japanese Laid-Open Patent Publication No. 2014-006116, the gap length is determined in correspondence with the distance (direct distance) from the target electric current sensor. However, there is a room of improvement in the method of utilizing the gap length of the core.

The present invention has been made taking the above problem into account, and an object of the present invention is to provide an electric power device and a method of producing the electric power device in which it is possible to effectively use the gap length of a gap for providing a detection element in a magnetic core in the case where there is influence of the ambient magnetic field.

An electric power device according to the present invention includes a reactor including a winding part, a first electric power line and a second electric power line extending on a lateral side of the reactor in a direction perpendicular to an axial direction of the reactor, a first electric current sensor including a first detection element and an annular first core with a first gap for providing the first detection element, and being configured to detect first electric current flowing through the first electric power line, a second electric current sensor including a second detection element and an annular second core with a second gap for providing the second detection element, and being configured to detect second electric current flowing through the second electric power line, and an electric circuit configured to make a maximum value of the first electric current larger than a maximum value of the second electric current. In the axial direction of the reactor, a distance between the second detection element and a central position of the winding part is smaller than a distance between the first detection element and the central position of the winding part, and a second gap length as a length of the second gap is smaller than a first gap length as a length of the first gap.

In the present invention, for the following reasons, it becomes possible to effectively use the gap length of the magnetic core with a gap for providing a detection element which is influenced by the ambient magnetic field.

That is, in the present invention, the first electric current sensor and the second electric current sensor detect the electric currents of the first electric power line and the second electric power line extending on the lateral side of the reactor. Therefore, the first electric current sensor and the second electric current sensor are provided at positions relatively close to the reactor, and influenced by the leakage magnetic flux from the reactor. The leakage magnetic flux of the reactor tends to be generated in a direction concentric with the reactor, or in a direction nearly concentric with the reactor.

The first electric power line and the second electric power line extend on the lateral side of the reactor in the direction perpendicular to the axial direction of the reactor. In the structure, the intensity of the magnetic field generated by the first electric current flowing through the first electric power line is detected by the first detection element. As a result, in the case of detecting the first electric current by the first electric current sensor, the direction of the magnetic field detected by the first detection element (detected magnetic field direction) may become close to the direction of the leakage magnetic flux of the reactor. Stated otherwise, as the distance between the first detection element and the central position of the winding part in the axial direction of the reactor gets shorter, the influence of the leakage magnetic flux on the first electric current sensor becomes large, and as the distance between the first detection element and the central position of the winding part in the axial direction of the reactor gets longer, influence of the leakage magnetic flux on the first electric current sensor may become small. This principle is applicable to the second electric current sensor as well.

In the present invention, in the axial direction of the reactor, the distance between the second detection element and the central position of the winding part is smaller than the distance between the first detection element and the central position of the winding part, and the second gap length as the length of the second gap is smaller than the first gap length as the length of the first gap.

Therefore, in the case where the influence of the leakage magnetic flux generated by the reactor is large for the second electric current sensor, the second gap length for the second electric current sensor is decreased to make it easy to detect the magnetic flux (magnetic flux which should be detected basically) generated in the second core in correspondence with the second electric current in the second electric power line. In this manner, it becomes possible to suppress variation in the sensitivity of the second electric current due to the leakage magnetic flux from the reactor. Thus, it becomes possible to improve the resistance of the second electric current sensor against the leakage magnetic flux from the reactor.

Further, in the case where the influence of the magnetic flux generated by the reactor is small for the first electric current sensor, the first gap length for the first electric current sensor is increased to reduce the influence of the magnetic flux (magnetic flux which should be detected basically) generated in the first core in correspondence with the first electric current in the first electric power line. In this manner, it becomes possible to suppress the influence on the linearity of the first electric current sensor, or saturation of the magnetic flux of the core. In particular, such effects are advantageous in the case where the maximum value of the first electric current is larger than the maximum value of the second electric current. Further, such effects are suitable in the case where the first detection element and the second detection element have structure according to the same specification.

The first detection element may be, e.g., a first Hall element, and the second detection element may be, e.g., a second Hall element. A magnetic field detection surface of the first Hall element may be provided at an angle whereby the magnetic field detection surface of the first Hall element is more closely parallel to an orientation of leakage magnetic flux generated by the reactor than a magnetic field detection surface of the second Hall element.

In the present invention, the magnetic detection field of the first detection element is provided more closely parallel to the orientation of the leakage magnetic flux generated by the reactor than the magnetic field detection surface of the second detection element, and the second gap length is smaller than the first gap length. Therefore, the second electric current sensor can be influenced easily by the magnetic flux (magnetic flux which should be detected basically) generated in the second core in correspondence with the second electric current in the second electric power line, and variation in the sensitivity of the second electric current due to the leakage magnetic flux is reduced. As a result, influence of the leakage magnetic flux from the reactor is suppressed relatively. Thus, it becomes possible to improve the resistance of the second electric current sensor against the leakage magnetic flux from the reactor.

Further, as for the first electric current sensor having the detected magnetic field direction remote from the orientation of the magnetic flux generated by the reactor (i.e., having small influence of the leakage magnetic flux from the reactor), the first gap length is increased. Therefore, by suppressing the influence of the magnetic flux (magnetic flux which should be detected basically) generated in the first core in correspondence with the first electric current in the first electric power line, it becomes possible to reduce the magnetic flux in correspondence with the DC component of the first electric current sensor, and suppress the influence on the linearity of the first electric current sensor or saturation of the magnetic flux of the core.

The second direct distance between the second detection element and the reactor may be smaller than a first direct distance between the first detection element and the reactor. Therefore, even in the case where the second electric current sensor having the detected magnetic field direction close to the orientation of the magnetic flux generated by the reactor (i.e., having large influence of the leakage magnetic flux from the reactor) is provided close to the reactor for reasons of design, by reducing the second gap length, it becomes possible to improve the resistance of the second electric current sensor against the leakage magnetic flux from the reactor.

For example, the reactor may be a magnetic coupling type reactor. Therefore, it becomes easy to provide the first electric current sensor and the second electric current sensor around the magnetic coupling type reactor having a variety of distributions in the orientation of the magnetic field in comparison with other types of reactors, and improve the freedom in design.

The first detection element and the second detection element may have structure according to same specification. Therefore, while the influence of the leakage magnetic flux from the reactor varies depending on the position, by adopting the common specification for the first detection element and the second detection element, it becomes possible to reduce the cost of the first detection element and the second detection element.

An outer diameter of the first core and an outer diameter of the second core may be same except the first gap and the second gap. In the structure, while the influence of the leakage magnetic flux from the reactor varies depending on the position, by adopting the first core and the second core having the same outer dimensions, it becomes possible to reduce the cost of the first core and the second core.

In a method of producing an electric power device according to the present invention, the electric power device includes a reactor including a winding part, a first electric current sensor including a first detection element and an annular first core with a first gap for providing the first detection element, and being configured to detect first electric current flowing through a first electric power line, and a second electric current sensor including a second detection element and an annular second core with a second gap for providing the second detection element, and being configured to detect second electric current flowing through a second electric power line. The method includes the steps of arranging the first detection element, the second detection element, and the reactor in a manner that a magnetic flux detection direction as a direction of magnetic flux detected by the first detection element and the second detection element and an axial direction of the reactor become same, and in the axial direction of the reactor, a distance between the second detection element and a central position of the winding part becomes smaller than a distance between the first detection element and the central position of the winding part, and making a second gap length as a length of the second gap smaller than a first gap length as a length of the first gap.

In the present invention, a magnetic flux detection direction as a direction of magnetic flux detected by the first detection element and the second detection element and an axial direction of the reactor are the same. Further, the leakage magnetic flux of the reactor tends to be generated in a direction concentric with the reactor, or in a direction nearly concentric with the reactor. Therefore, in the axial direction of the reactor, as the distance between the first detection element and the central position of the winding part gets longer, a shift between the direction of the leakage magnetic flux and the magnetic flux detection direction becomes large. This principle is applicable to the second electric current sensor as well.

Further, in the present invention, in the axial direction of the reactor, the distance between the second detection element and the winding part is smaller than the distance between the first detection element and the central position of the winding part. Additionally, the second gap length as the length of the second gap is smaller than the first gap length as the length of the first gap.

Therefore, as for the second electric current sensor having the magnetic field detection direction close to the leakage magnetic flux generated by the reactor (i.e., having large influence of leakage magnetic flux from the reactor), the second gap length is reduced. Accordingly, the influence of the magnetic flux (magnetic flux which should be detected basically) generated in the second core in correspondence with the second electric current in the second electric power line, on the second electric current sensor is increased and variation in the sensitivity of the second electric current due to the leakage magnetic flux is decreased. As a result, the influence of the leakage magnetic flux from the reactor is suppressed relatively. Thus, it becomes possible to improve the resistance of the second electric current sensor against the leakage magnetic flux from the reactor.

Further, as for the first electric current sensor having the magnetic field detection direction remote from the orientation of the leakage magnetic flux generated by the reactor (i.e., having small influence from the reactor), the first gap length is increased. Therefore, by suppressing the influence of the magnetic flux (magnetic flux which should be detected basically) generated in the first core in correspondence with the first electric current in the first electric power line, the magnetic flux corresponding to the DC component of the first electric current sensor is reduced. Accordingly, it becomes possible to suppress the influence on the linearity of the first electric current sensor, or saturation of the magnetic flux of the core.

In the present invention, in the case where there is influence of the ambient magnetic field, it is possible to effectively use the gap length of the gap for providing the detection element in the magnetic core.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 9 is a plan view showing an example of a magnetic field (leakage magnetic flux) generated by the reactor according to the embodiment.

DESCRIPTION OF THE PREFERRED EMBODIMENTS

A. Embodiment

A-1. Structure

[A-1-1. Overall Structure]

Figure 1:
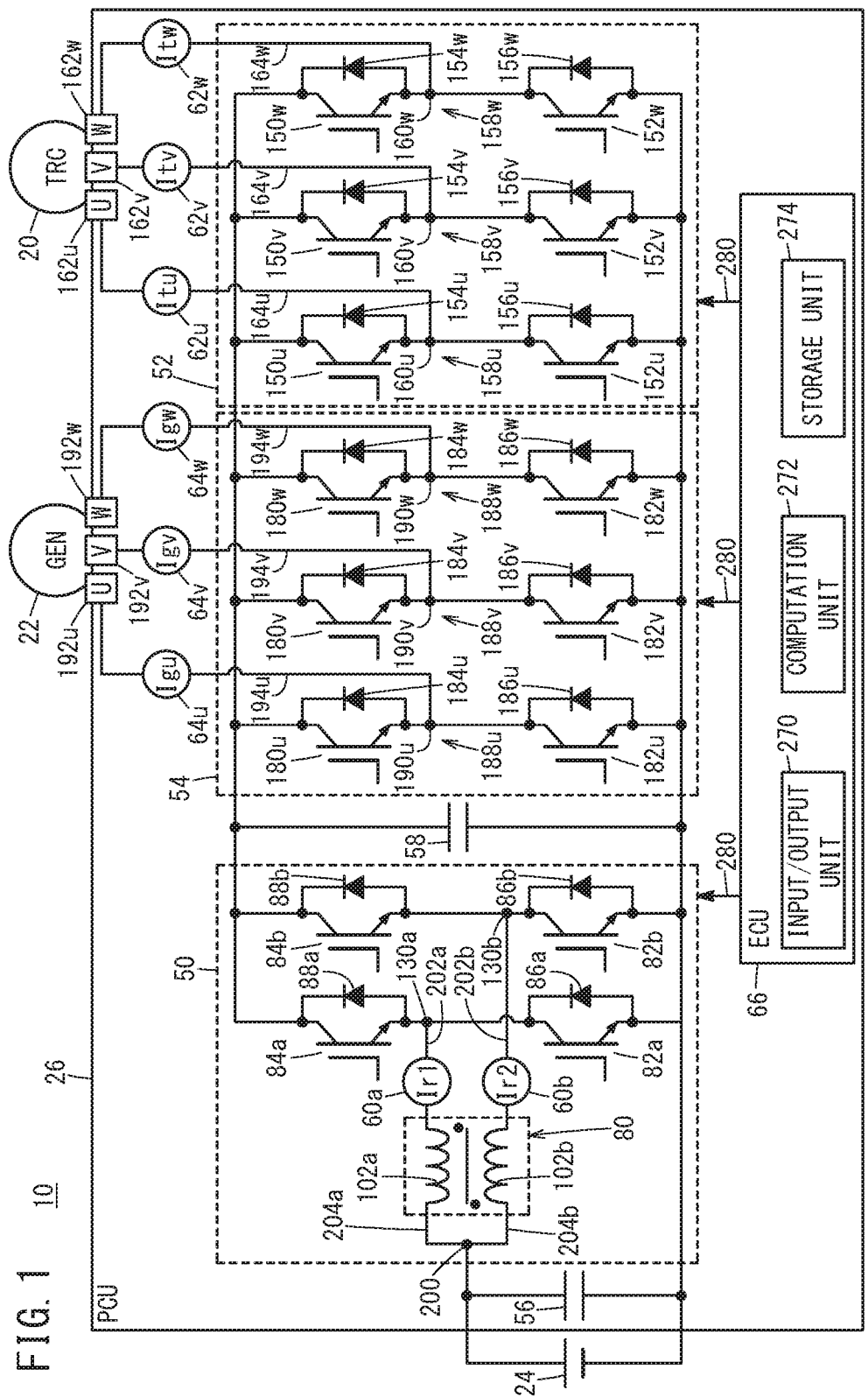
FIG. 1 is an electric circuit diagram schematically showing a vehicle including a power control unit (hereinafter referred to as the "PCU") as an electric power device according to one embodiment of the present invention.

FIG. 1 is an electric circuit diaphragm schematically showing structure of a vehicle 10 including a power control unit 26 (hereinafter referred to as the "PCU 26") as an electric power device according to one embodiment of the present invention. In addition to the PCU 26, the vehicle 10 includes a traction motor 20, a generator 22, and a high voltage battery 24 (hereinafter also referred to as the "battery 24" or "BAT 24"). The vehicle 10 is a hybrid vehicle. As a traction drive source, the vehicle 10 includes an engine (not shown) in addition to the traction motor 20. As described later, the vehicle 10 may be a vehicle of another type. The generator 22 performs power generation based on a drive force of the engine. The generator 22 may be used as the traction drive source.

The PCU 26 converts or adjusts electric power from the battery 24, and supplies the electric power to the traction motor 20. Further, the PCU 26 converts or adjusts power generation electric power Pgen of the generator 22 and power generation electric power (regenerative electric power Preg) of the traction motor 20 to charge the battery 24.

[A-1-2. Traction Motor 20]

The traction motor 20 is a three-phase AC brushless type motor. The traction motor 20 generates a drive force Ftrc as a traction drive source of the vehicle 10, and provides the driving force Ftrc for the wheels (drive wheels) (not shown). That is, the traction motor 20 is driven by one of, or by both of electric power Pbat from the high voltage battery 24 and the electric power Pgen from the generator 22. Further, the traction motor 20 performs regenerative operation at the time of braking the vehicle 10, and supplies the regenerative electric power Preg to the battery 24. The regenerative electric power Preg may be supplied to electric auxiliary equipment (not shown).

Hereinafter, the traction motor 20 may also be referred to as the TRC motor 20. The TRC motor 20 may have the function of a generator, in addition to, or instead of the function of the traction motor. Hereinafter, the parameters related to the traction motor 20 are labeled with "TRC" or "trc", or "t". Further, in FIG. 1, etc., the traction motor 20 is labeled with "TRC".

[A-1-3. Generator 22]

The generator 22 is a three-phase AC brushless type generator, and functions as a generator for performing power generation using the drive force Feng from the engine. The electric power Pgen generated by the generator 22 is supplied to the battery 24, the traction motor 20, or electrically operated auxiliary devices.

Hereinafter, the generator 22 will also be referred to as the GEN 22. The GEN 22 may have the function of a traction motor, in addition to, or instead of the function of the generator (power generator). Hereinafter, the parameters related to the generator 22 are labeled with "GEN" or "gen", or "g". Further, in FIG. 1, etc. the generator 22 is labeled with "GEN". The generator 22 may be used as a starter motor of the engine.

[A-1-4. High Voltage Battery 24]

The high voltage battery 24 is an energy storage including a plurality of battery cells, and capable of outputting high voltage (several hundreds of volts). For example, a lithium ion secondary battery, or a nickel hydrogen (or nickel-metal hydride) secondary battery may be used as the high voltage battery 24. Instead of, or in addition to the battery 24, an energy storage such as a capacitor may be used.

[A-1-5. PCU 26]

(A-1-5-1. Overview of PCU 26)

The PCU 26 converts or adjusts the electric power from the battery 24, and supplies the electric power to the traction motor 20. Further, the PCU 26 converts or adjusts the power generation electric power Pgen of the generator 22 and the regenerative electric power Preg of the traction motor 20, and charges the battery 24.

As shown in FIG. 1, the PCU 26 includes a DC/DC converter 50, a first inverter 52, a second inverter 54, a first capacitor 56, a second capacitor 58, reactor electric current sensors 60$a$, 60$b$, TRC electric current sensors 62$u$, 62$v$, 62$w$, GEN electric current sensors 64$u$, 64$v$, 64$w$, and an electronic control device (or an electronic control unit) 66 (hereinafter referred to as the "ECU 66").

(A-1-5-2. DC/DC Converter 50)

(A-1-5-2-1. Overview of DC/DC Converter 50)

The DC/DC converter 50 (hereinafter also referred to as the "converter 50") is a step-up/down (voltage boost/buck) converter. The converter 50 steps up the output voltage Vbat (hereinafter also referred to as the "battery voltage Vbat") of the battery 24, and outputs the stepped up voltage to the TRC motor 20. Further, the converter 50 steps down the output voltage Vgen (hereinafter also referred to as the "GEN voltage Vgen") of the generator 22 or the output voltage Vreg (hereinafter also referred to as the "regenerative voltage Vreg") of the traction motor 20, and outputs the stepped down voltage to the battery 24.

The converter 50 includes a reactor 80, lower switching elements 82$a$, 82$b$, and upper switching elements 84$a$, 84$b$. Diodes 86$a$, 86$b$, 88$a$, 88$b$ are connected to the lower switching elements 82$a$, 82$b$ and the upper switching elements 84$a$, 84$b$ in parallel, respectively.

At the time of stepping up the battery voltage Vbat, after turning on the lower switching elements 82$a$, 82$b$ at the same time to store electric energy in the reactor 80, the lower switching elements 82$a$, 82$b$ are turned off at the same time to release the electric energy stored in the reactor 80 to the traction motor 20. When the GEN voltage Vgen or the regenerative voltage Vreg is stepped down, the upper switching elements 84$a$, 84$b$ are turned on to store electric energy in the reactor 80, and then, the upper switching elements 84$a$, 84$b$ are tuned off to charge the battery 24 using the electric energy stored in the reactor 80.

(A-1-5-2-2. Reactor 80)

Figure 2:
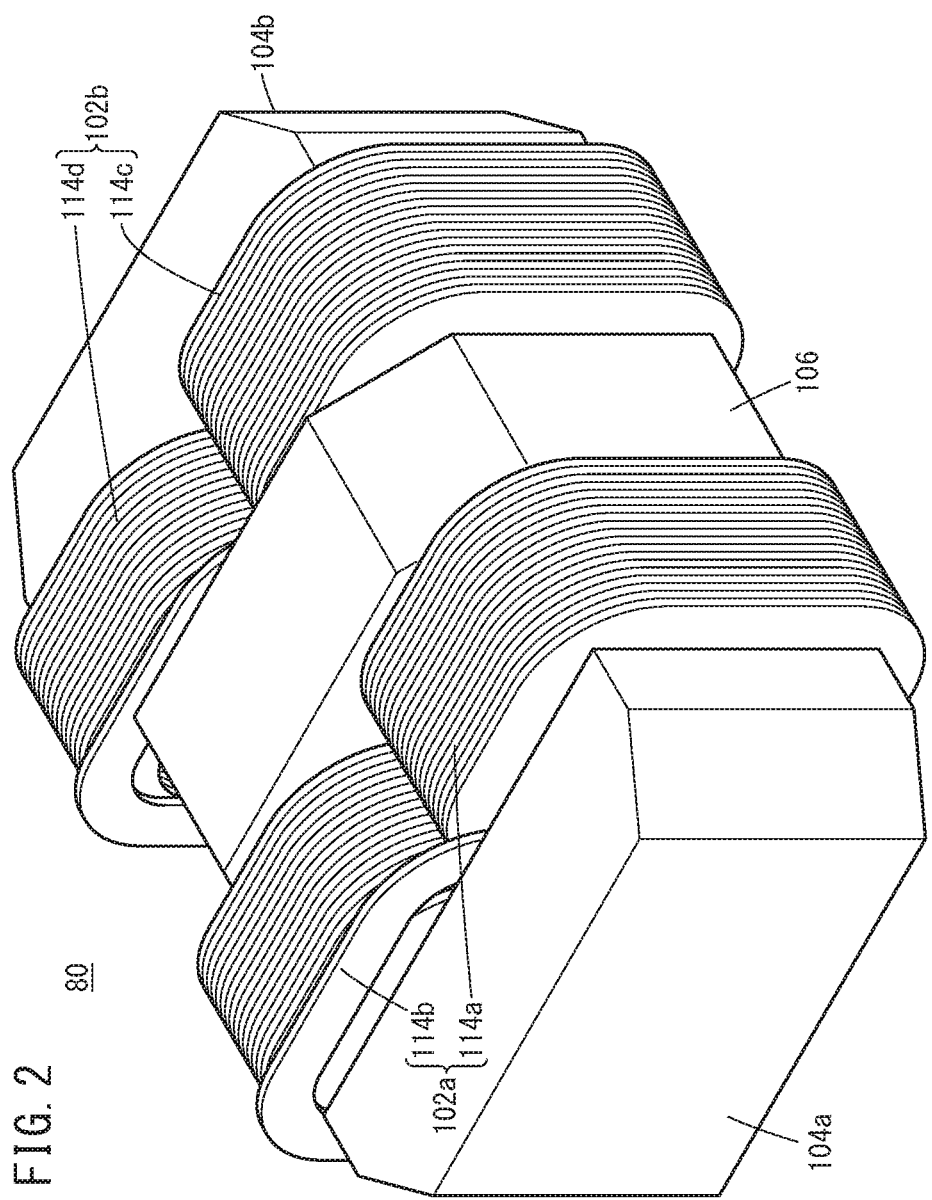
FIG. 2 is a perspective view schematically showing a reactor according to the embodiment.
Figure 3:
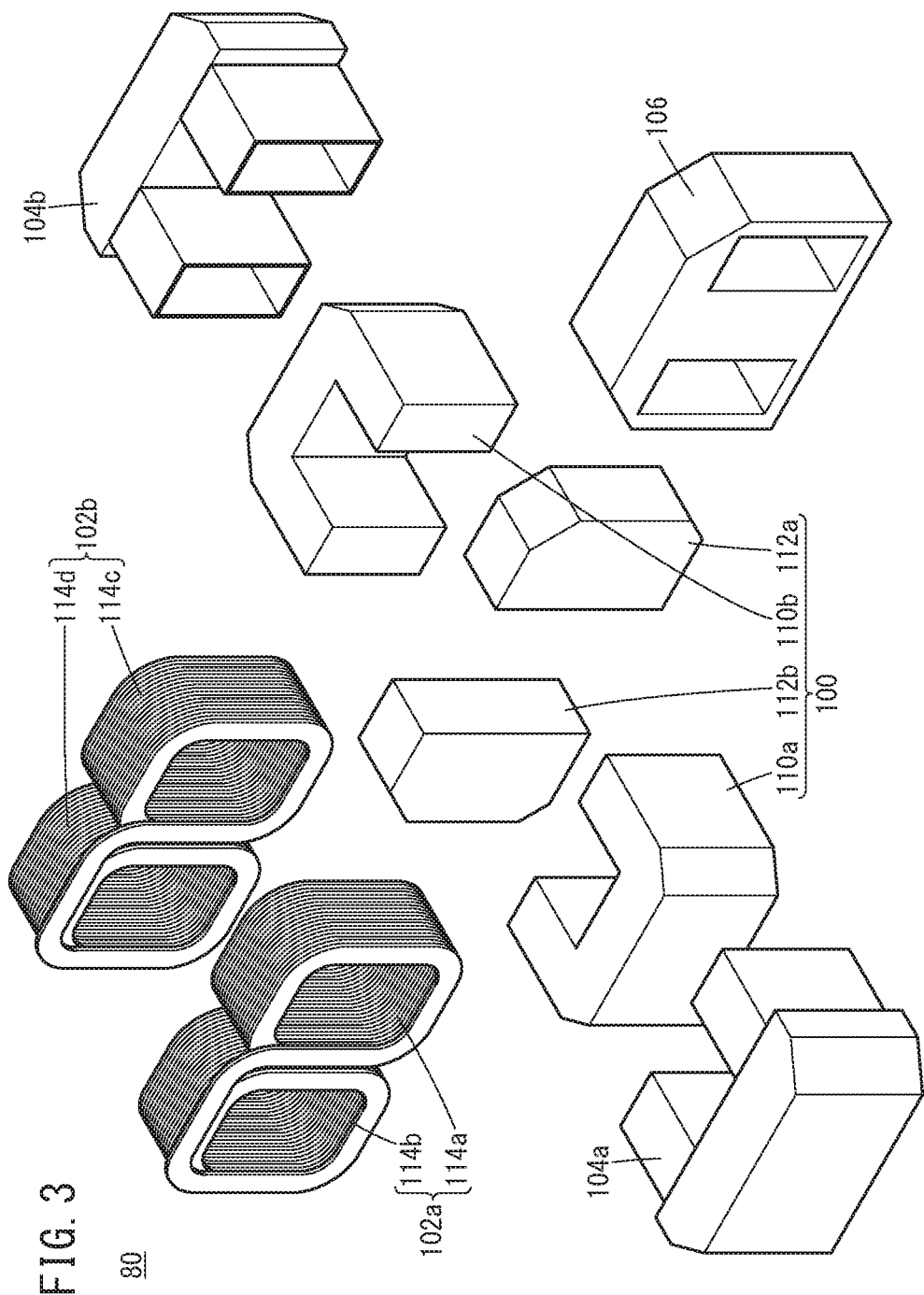
FIG. 3 is an exploded perspective view schematically showing the reactor according to the embodiment.

FIG. 2 is a perspective view schematically showing the reactor 80 according to an embodiment of the present invention. FIG. 3 is an exploded perspective view schematically showing the reactor 80 according to the embodiment. In the embodiment, though the reactor 80 is a magnetic coupling type reactor, the reactor 80 may be of a reactor of another type.

As shown in FIGS. 2 and 3, the reactor 80 includes an annular core 100 (FIG. 3), two coupling coils 102$a$, 102$b$, first core cover parts 104$a$, 104$b$, and a second core cover part 106. The annular core 100 is made up of combination of two U-shaped cores 110$a$, 110$b$, two I-shaped cores 112$a$, 112$b$ to have a "θ" shape of Greek alphabet letter.

The coupling coil 102$a$ is divided into a first winding part 114$a$ and a second winding part 114$b$, and wound around the annular core 100. The coupling coil 102$b$ is divided into a third winding part 114$c$ and a fourth winding part 114$d$, and wound around the annular core 100.

The reactor 80 may adopt structure as described in any of Japanese Laid-Open Patent Publication No. 2016-066720 and Japanese Laid-Open Patent Publication No. 2016-066744.

(A-1-5-2-3. Lower Switching Elements 82$a$, 82$b$ and Upper Switching Elements 84$a$, 84$b$)

As shown in FIG. 1, the lower switching element 82$a$ is connected between the negative electrode of the battery 24 and a branch point 130$a$. The lower switching element 82$b$ is connected between the negative electrode of the battery 24 and a branch point 130$b$. The upper switching element 84$a$ is connected between the branch point 130$a$ and a point between the traction motor 20 and the generator 22. The upper switching element 84$b$ is connected between the branch point 130$b$ and a point between the traction motor 20 and the generator 22.

The lower switching elements 82$a$, 82$b$ and the upper switching elements 84$a$, 84$b$ are made up of MOSFETs (metal-oxide semiconductor field-effect transistors), IGBTs (insulated gate bipolar transistors), etc.

(A-1-5-3. First Inverter 52)

The first inverter 52 converts the DC electric current from the battery 24 to the AC electric current, and supplies the AC electric current to the traction motor 20. Further, the first inverter 52 converts AC electric current from the traction motor 20 into the DC electric current, and supplies the DC electric current to the battery 24.

As shown in FIG. 1, the first inverter 52 includes three-phase upper switching elements 150$u$, 150$v$, 150$w$, and three-phase lower switching elements 152$u$, 152$v$, 152$w$. Diodes 154$u$, 154$v$, 154$w$ are connected to the upper switching elements 150$u$, 150$v$, 150$w$ in parallel. Diodes 156$u$, 156$v$, 156$w$ are connected to the lower switching elements 152$u$, 152$v$, 152$w$ in parallel. The upper switching element 150$u$ and the lower switching element 152$u$ form a U-phase arm 158$u$. The upper switching element 150$v$ and the lower switching element 152$v$ form a V-phase arm 158$v$. The upper switching element 150$w$ and the lower switching element 152$w$ form a W-phase arm 158$w$.

In the U-phase arm 158$u$, a node 160$u$ between the upper switching element 150$u$ and the lower switching element 152$u$ is connected to a U-phase terminal 162$u$ of the traction motor 20 through a bus bar 164$u$. In the V-phase arm 158$v$, a node 160$v$ between the upper switching element 150$v$ and the lower switching element 152$v$ is connected to a V-phase terminal 162$v$ of the traction motor 20 through a bus bar 164$v$. In the W-phase arm 158$w$, a node 160$w$ between the upper switching element 150$w$ and the lower switching element 152$w$ is connected to a W-phase terminal 162$w$ of the traction motor 20 through a bus bar 164$w$. Hereinafter, the bus bars 164$u$, 164$v$, 164$w$ will also be referred to as a bus bar 164, collectively.

(A-1-5-4. Second Inverter 54)

The second inverter 54 converts the AC electric current from the generator 22 into the DC electric current, and supplies the DC electric current to the battery 24. Further, in the case where the generator 22 is used as a traction drive source, the second inverter 54 converts the DC electric current from the battery 24 into the AC electric current, and supplies the AC electric current to the generator 22.

As shown in FIG. 1, the second inverter 54 includes three-phase upper switching elements 180u, 180v, 180w, and three-phase lower switching elements 182u, 182v, 182w. Diodes 184u, 184v, 184w are connected to the upper switching elements 180u, 180v, 180w in parallel. Diodes 186u, 186v, 186w are connected to the lower switching elements 182u, 182v, 182w in parallel. The upper switching element 180u and the lower switching element 182u form a U-phase arm 188u. The upper switching element 180v and the lower switching element 182v form a V-phase arm 188v. The upper switching element 180w and the lower switching element 182w form a W-phase arm 188w.

In the U-phase arm 188u, a node 190u between the upper switching element 180u and the lower switching element 182u is connected to a U-phase terminal 192u of the generator 22 through a bus bar 194u. In the V-phase arm 188v, a node 190v between the upper switching element 180v and the lower switching element 182v is connected to a V-phase terminal 192v of the generator 22 through a bus bar 194v. In the W-phase arm 188w, a node 190w between the upper switching element 180w and the lower switching element 182w is connected to a W-phase terminal 192w of the generator 22 through a bus bar 194w. Hereinafter, the bus bars 194u, 194v, 194w are referred to as a bus bar 194, collectively.

(A-1-5-5. First Capacitor 56 and Second Capacitor 58)

The first capacitor 56 and the second capacitor 58 function as smoothing capacitors.

(A-1-5-6. Reactor Electric Current Sensors 60a, 60b)

The reactor electric current sensor 60a (FIG. 1) detects electric current Ir1 (hereinafter also referred to as the reactor electric current Ir1") flowing between the coupling coil 102a and the branch point 130a. Stated otherwise, the reactor electric current sensor 60a detects the electric current Ir1 flowing through a bus bar 202a connecting the coupling coil 102a and the branch point 130a. The reactor electric current sensor 60a may be provided between the positive electrode (branch point 200) of the battery 24 and the coupling coil 102a. Stated otherwise, the reactor electric current sensor 60a may detect electric current flowing through a bus bar 204a connecting the branch point 200 and the coupling coil 102a.

The reactor electric current sensor 60b detects the electric current (hereinafter also referred to as the "reactor electric current Ir2") flowing between the coupling coil 102b and the branch point 130b. Stated otherwise, the reactor electric current sensor 60b detects electric current Ir2 flowing through a bus bar 202b connecting the coupling coil 102b and the branch point 130b. The reactor electric current sensor 60b may be provided between the positive electrode (branch point 200) of the battery 24 and the coupling coil 102b. Stated otherwise, the reactor electric current sensor 60b may detect electric current flowing through a bus bar 204b connecting the branch point 200 and the coupling coil 102b.

(A-1-5-7. TRC Electric Current Sensors 62u, 62v, 62w)
(A-1-5-7-1. Overview of TRC Electric Current Sensors 62u, 62v, 62w)

As shown in FIG. 1, TRC electric current sensors 62u, 62v, 62w (hereinafter also referred to as the "electric current sensors 62u, 62v, 62w" or the "sensors 62u, 62v, 62w) detect electric currents Itu, Itv, Itw flowing between the first inverter 52 and the traction motor 20.

More specifically, the sensor 62u detects electric current Itu (hereinafter also referred to as the "TRC electric current Itu" or the "U-phase electric current Itu") flowing through the bus bar 164u connecting the U-phase arm 158u and the U-phase terminal 162u of the motor 20. The sensor 62v detects electric current Itv (hereinafter also referred to as the "TRC electric current Itv" or the "V-phase electric current Itv") flowing through the bus bar 164v connecting the V-phase arm 158v and the V-phase terminal 162v of the motor 20. The sensor 62w detects electric current Itw (hereinafter also referred to as the "TRC electric current Itw" or the "W-phase electric current Itw") flowing through the bus bar 164w connecting the W-phase arm 158w and the W-phase terminal 162w of the motor 20.

Hereinafter, the TRC electric current sensors 62u, 62v, 62w will be referred to as the TRC electric current sensor 62 or the sensor 62 collectively. Further, the electric currents Itu, Itv, Itw will be referred to as the electric current It collectively. In the embodiment of the present invention, the number of the sensors 62 is three. Alternatively, the number of the sensors 62 may be two or four or more.

(A-1-5-7-2. Specific Structure of TRC Electric Current Sensors 62u, 62v, 62w)

Figure 4A:
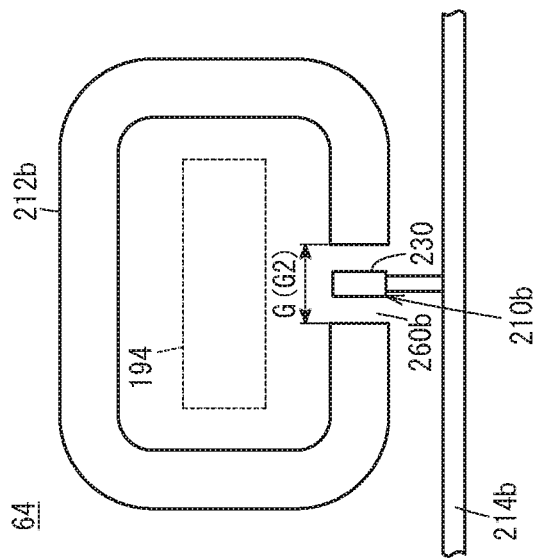
FIG. 4A is a plan view showing a part of a TRC electric current sensor according to the embodiment.
Figure 6:
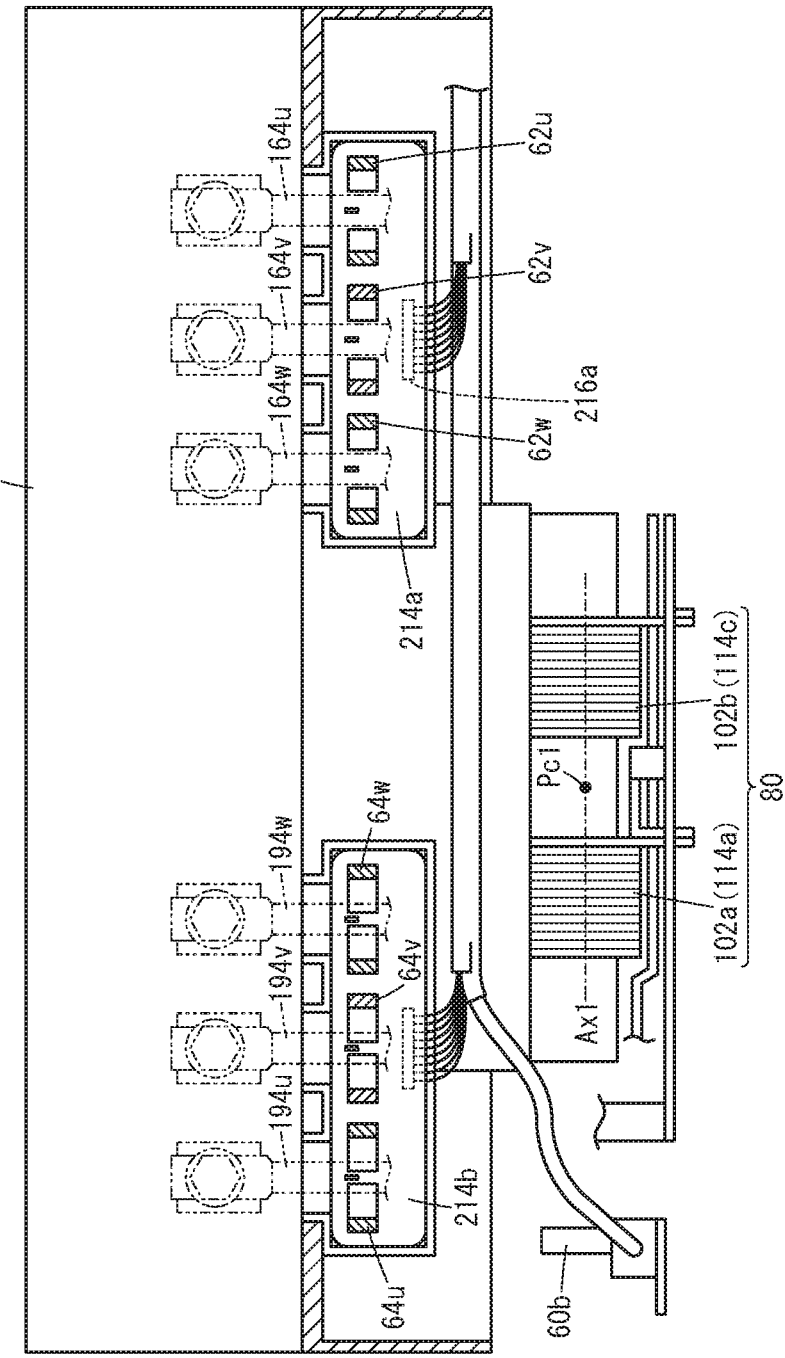
FIG. 6 is a side view schematically showing the layout of a part of the PCU according to the embodiment.

FIG. 4A is a plan view showing a part of the TRC electric current sensor 62 according to the embodiment of the present invention. Each electric current sensor 62 includes a Hall IC 210a (IC: integrated circuit) and a magnetic core 212a (hereinafter also referred to as the "core 212"). Further, the electric current sensors 62u, 62v, 62w have a common substrate 214a. The Hall ICs 210a are fixed to the substrate 214a. A connector 216a is provided at one end of the substrate 214a (FIG. 6). The Hall IC 210a and the core 212a of the electric current sensor 62u, the Hall IC 210a and the core 212a of the electric current sensor 62v, and the Hall IC 210a and the core 212a of the electric current sensor 62w have structure according to the same specification.

Figure 5:
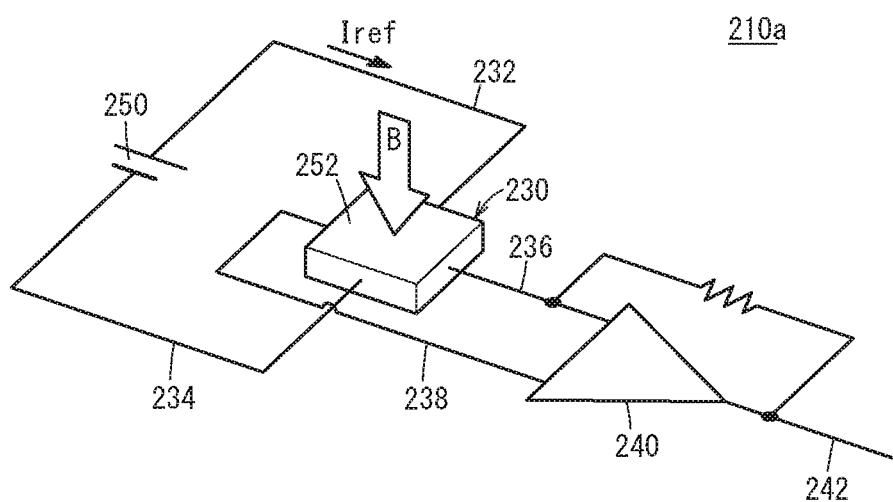
FIG. 5 is a view illustrating a detection principle of a Hall element included in a Hall IC according to the embodiment.

FIG. 5 is a view illustrating a detection principle of a Hall element 230 included in the Hall IC 210a according to the embodiment. The Hall element 230 is a magnetism detection element for detecting a magnetic field B or magnetic flux φ. Though the Hall element 230 is known in general, for ease of understanding of the embodiment of the present invention, the description about the Hall element 230 will be given below.

The Hall IC 210a includes, in addition to the Hall element 230, a power supply voltage line 232 (reference voltage line), a ground line 234, and output lines 236, 238. The output lines 236, 238 are connected to an operational amplifier 240, and the output of the operational amplifier 240 is supplied to a signal line 242. In the Hall IC 210a, the power supply voltage line 232 and the ground line 234 are connected to a low voltage power supply 250, and electric current (reference electric current Iref) is supplied to the power supply voltage line 232 and the ground line 234. In this state, when the magnetic field B is applied perpendicularly to a magnetic field detection surface 252 of the Hall element 230, (stated otherwise, when the magnetic field B is applied perpendicularly to the reference electric current Iref), an electromotive force E is generated in a direction perpendicular to the reference electric current Iref and the magnetic field B (i.e., the output lines 236, 238). Therefore, by collecting the electromotive force E through the operational amplifier 240, it is possible to know the intensity of the magnetic field B (or electric current which generates the magnetic field B).

The core 212a (FIG. 4A) is made of magnetic material basically in the form of an annular shape. A gap 260a is formed in part of the core 212a, for providing the Hall element 230. An air as insulating material is present between the Hall element 230 and the core 212a. Insulating material other than the air may be provided between the Hall element 230 and the core 212a. Using the core 212a, it is possible to converge the magnetic flux ϕ generated around detection target conductor (bus bar 164 herein), and improve the sensitivity of the Hall element 230.

As can be seen from FIG. 4A, in the state where the Hall element 230 is provided in the gap 260a, the Hall element 230 is provided in a manner that the magnetic field detection surface 252 (FIG. 5) of the Hall element 230 faces the core 212a. Further, part of the Hall IC 210a other than the Hall element 230 is provided on the sensor substrate 214a. Though the Hall element 230 is described as part of the Hall IC 210a, the Hall element 230 may be handled as a component part which is provided separately from the Hall IC 210a.

Hereinafter, the length of the gap 260a is referred to as the gap length G. As shown in FIG. 4A, the gap length G is a distance between ends of the core 212a. As described later in detail, in the embodiment of the present invention, the gap length G (hereinafter referred to as the "gap length G1") of the TRC electric current sensors 62u, 62v, 62w is different from the gap length G (hereinafter referred to as the "gap length G2") of the GEN electric current sensors 64u, 64v, 64w.

(A-1-5-8. GEN Electric Current Sensors 64u, 64v, 64w)

(A-1-5-8-1. Overview of GEN Electric Current Sensors 64u, 64v, 64w)

As shown in FIG. 1, GEN electric current sensors 64u, 64v, 64w (hereinafter also referred to as the "electric current sensors 64u, 64v, 64w" or the "sensors 64u, 64v, 64w") detect electric currents Igu, Igv, Igw flowing between the second inverter 54 and the generator 22.

More specifically, the sensor 64u detects electric current Igu (hereinafter also referred to as the "GEN electric current Igu" or the "U-phase electric current Igu") flowing through the bus bar 194u connecting the U-phase arm 188u and the U-phase terminal 192u of the generator 22. The sensor 64v detects electric current Igv (hereinafter also referred to as the "GEN electric current Igv" or the "V-phase electric current Igv") flowing through the bus bar 194v connecting the V-phase arm 188v and the V-phase terminal 192v of the generator 22. The sensor 64w detects electric current Igw (hereinafter also referred to as the "GEN electric current Igw" or the "W-phase electric current Igw") flowing through the bus bar 194w connecting the W-phase arm 188w and the W-phase terminal 192w of the generator 22.

Hereinafter, the GEN electric current sensors 64u, 64v, 64w will be referred to as the GEN electric current sensor 64 or the sensor 64 collectively. Further, the electric currents Igu, Igv, Igw will be referred to as the electric current Ig collectively. In the embodiment of the present invention, the number of the sensors 64 is three. Alternatively, the number of the sensors 64 may be two or four or more.

(A-1-5-8-2. Specific Structure of GEN Electric Current Sensors 64u, 64v, 64w)

Figure 4B:
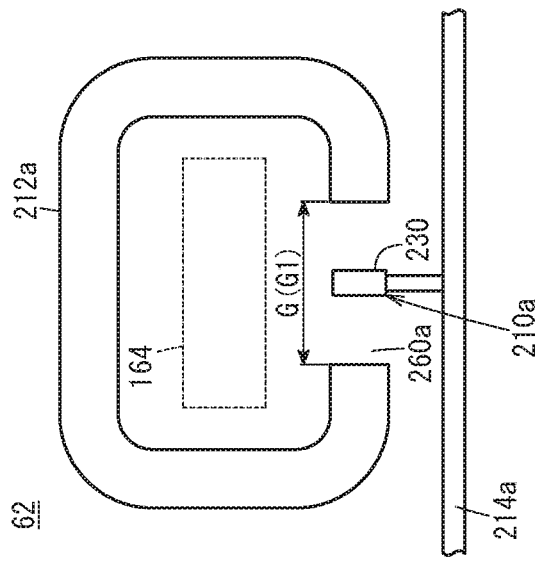
FIG. 4B is a plan view showing a part of a GEN electric current sensor according to the embodiment.

FIG. 4B is a plan view showing a part of the GEN electric current sensor 64 according to the embodiment of the present invention. The electric current sensors 64 have the same structure as the TRC electric current sensors 62. For example, a Hall IC 210b, a core 212b, and a substrate 214b of each of the sensors 64u, 64v, 64w have structure according to the same specification as that of the Hall IC 210a, the core 212a, and the substrate 214a of each of the sensors 62u, 62v, 62w. It should be noted that the gap length G2 of the magnetic core 212b of the GEN electric current sensors 64 is different from the gap length G1 of the core 212a of the TRC electric current sensors 62.

As shown in FIGS. 4A and 4B, the gap length G2 is smaller than the gap length G1. This is mainly based on the difference in the positional relationship among the TRC electric current sensor 62, the GEN electric current sensor 64, and the reactor 80 (detailed description about this point will be given with reference to FIGS. 6 to 9).

(A-1-5-9. ECU 66)

The ECU 66 is a control circuit (or control device) for controlling components of the PCU 26. As shown in FIG. 1, the ECU 66 includes an input/output unit 270, a computation unit 272, and a storage unit 274. The input/output unit 270 inputs/outputs signals to/from components of the vehicle 10 through a signal line 280 (communications line). In FIG. 1, it should be noted that the communications line 280 is shown in a simplified form. The input/output unit 270 includes an A/D converter circuit (not shown) for converting an inputted analog signal to a digital signal.

The computation unit 272 includes a central computation unit (CPU), and the computation unit 272 is operated by executing a program stored in the storage unit 274. Some of the functions of the computation unit 272 may be realized by a logic IC (integrated circuit). The program may be supplied from the outside through a wireless communications device (not shown) (portable phone, smart phone, etc.). In the computation unit 272, part of the program may be made up of hardware (circuit component part).

The computation unit 272 of the embodiment of the present invention performs switching of the reactor 80 using an arbitral value, e.g., in the range of 10 to 20 kHz. Further, the computation unit 272 converts outputs from the TRC electric current sensors 62u, 62v, 62w and the GEN electric current sensors 64u, 64v, 64w into digital values, and uses the digital values.

The storage unit 274 stores programs and data used by the computation unit 272, and includes a random access memory (hereinafter referred to as the "RAM"). As the RAM, a volatile memory such as a register, and a non-volatile memory such as a flash memory may be used. Further, the storage unit 274 may include a read only memory (hereinafter referred to as the "ROM"), in addition to the RAM.

A-2. Layout of Component Parts

Next, the layout of component parts mainly in connection with the TRC electric current sensors 62u, 62v, 62w and the GEN electric current sensors 64u, 64v, 64w will be described below. In the embodiment of the present invention, in order to reduce the influence of the leakage magnetic flux ϕl from the reactor 80, the relative position among the TRC electric current sensors 62, the GEN electric current sensors 64, and the reactor 80, and the gap lengths G1, G2 of the sensors 62, 64 are adjusted.

Figure 7:
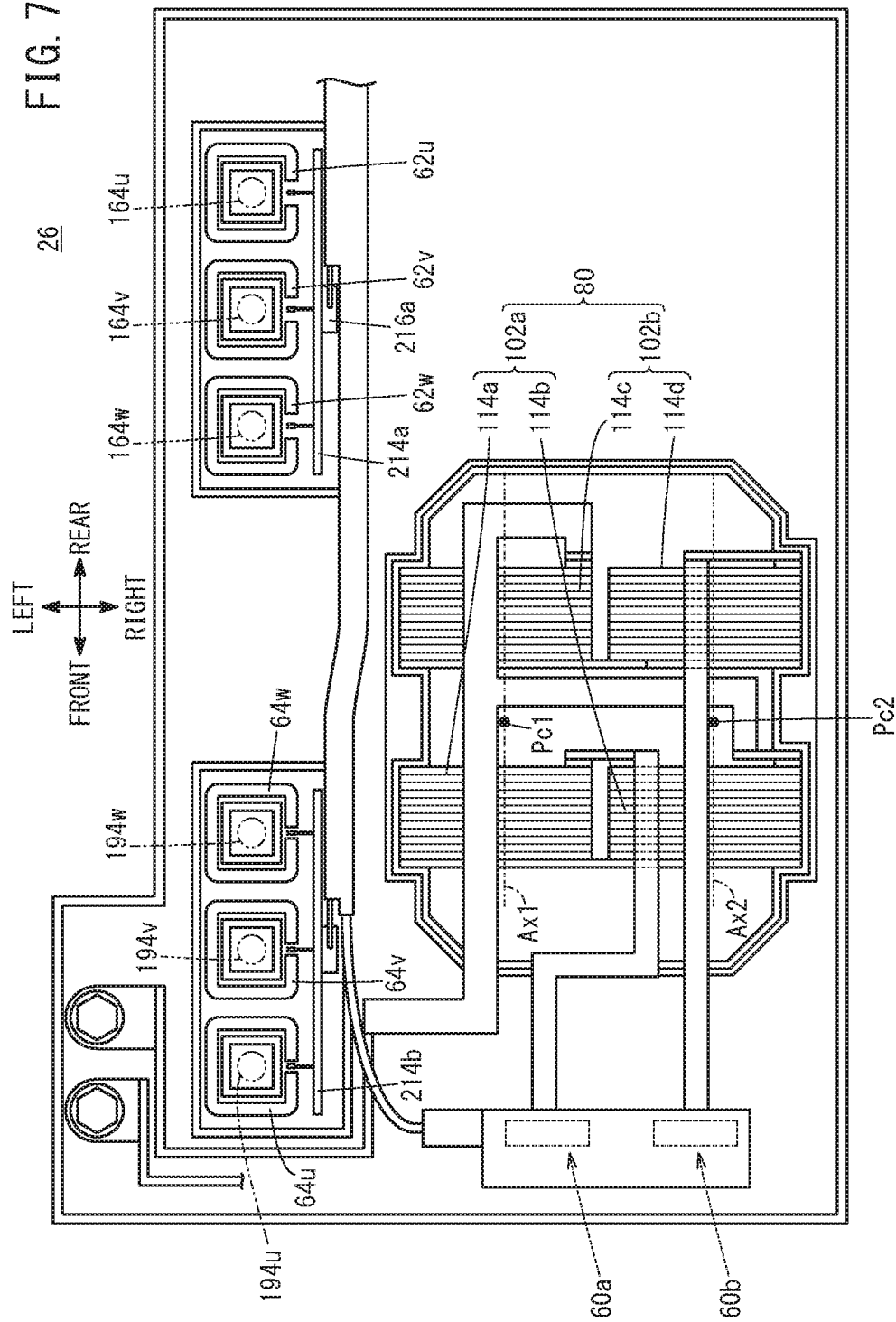
FIG. 7 is a bottom view schematically showing the layout of a part of the PCU according to the embodiment.
Figure 8:
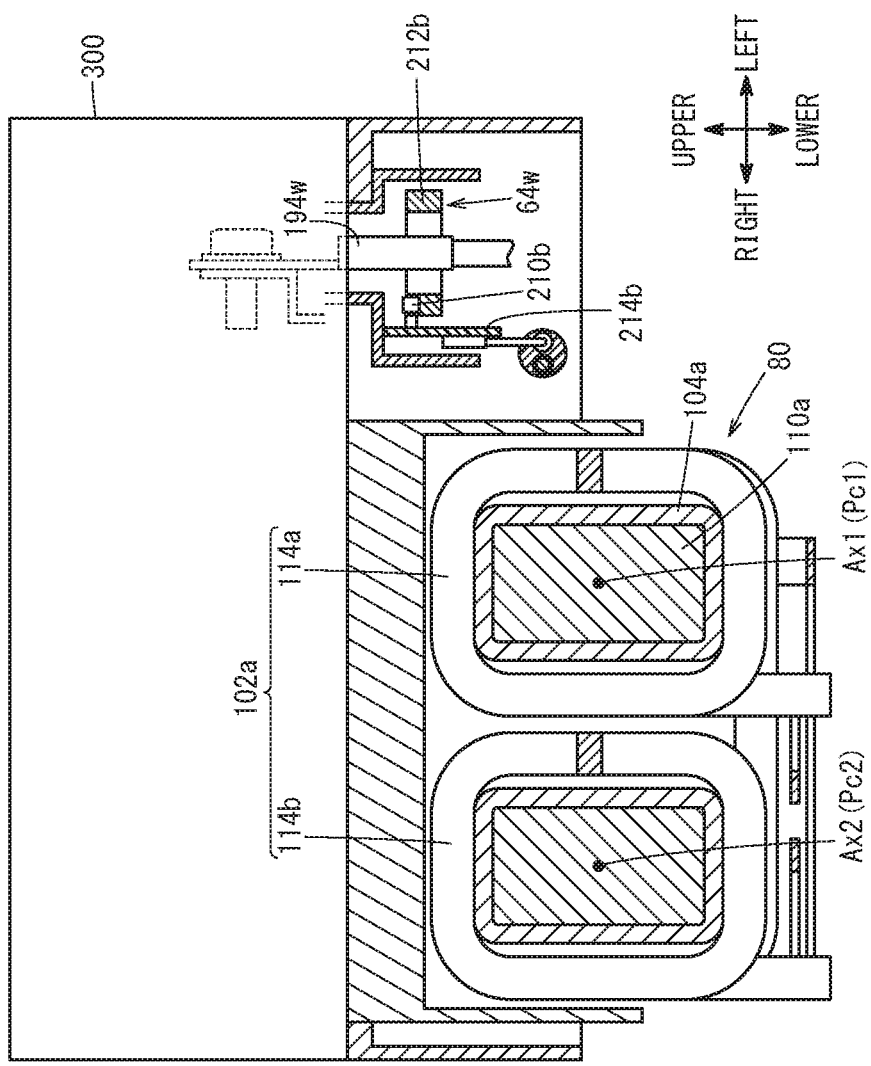
FIG. 8 is a front view schematically showing the layout of a part of the PCU according to the embodiment.

FIG. 6 is a side view schematically showing the layout of a part of the PCU 26 according to the embodiment of the present invention. FIG. 7 is a bottom view schematically showing the layout of a part of the PCU 26 according to the embodiment of the present invention. FIG. 8 is a front view schematically showing the layout of a part of the PCU 26 according to the embodiment of the present invention. The directions shown in FIGS. 6 to 8 are based on the vehicle 10.

A reference numeral 300 in FIGS. 6 and 8 denotes a switching unit formed by assembling switching elements of the converter 50, the first inverter 52, and the second inverter 54. That is, the switching unit 300 (electric circuit) includes lower switching elements 82a, 82b and upper switching elements 84a, 84b of the converter 50, upper switching elements 150u, 150v, 150w and lower switching elements 152u, 152v, 152w of the first inverter 52, and upper switching elements 180u, 180v, 180w and lower switching elements 182u, 182v, 182w of the second inverter 54. The switching unit 300 includes the ECU 66 as well.

As shown in FIGS. 6 to 8, the magnetic coupling type reactor 80 is provided at a lower position of the PCU 26. In this regard, the coil axes Ax1, Ax2 are in alignment with the front/rear direction of the vehicle 10.

As shown in FIGS. 6 and 8, the TRC electric current sensors 62u, 62v, 62w, and the GEN electric current sensors 64u, 64v, 64w are provided above the reactor 80. Further, as shown in FIG. 7, the TRC electric current sensors 62u, 62v, 62w and the GEN electric current sensors 64u, 64v, 64w are shifted to the left side compared with the reactor 80.

Further, as shown in FIGS. 6 and 7, the TRC electric current sensors 62u, 62v, 62w and the GEN electric current sensors 64u, 64v, 64w are shifted from the reactor 80 in the front/rear direction. Specifically, the TRC electric current sensors 62u, 62v, 62w are provided on the rear side of the reactor 80. The GEN electric current sensors 64u, 64v, 64w are provided on the front side of the reactor 80.

As shown in FIG. 6, the positions of the TRC electric current sensors 62u, 62v, 62w and the positions of the GEN electric current sensors 64u, 64v, 64w in the upper/lower direction are the same. Further, the positions of the TRC electric current sensors 62u, 62v, 62w and the positions of the GEN electric current sensors 64u, 64v, 64w in the left/right direction are the same.

As shown in FIG. 6, in the front/rear direction, the TRC electric current sensors 62u, 62v, 62w and the GEN electric current sensors 64u, 64v, 64w are arranged in parallel. In this regard, the TRC electric current sensors 62u, 62v, 62w are remoter than the GEN electric current sensors 64u, 64v, 64w, from the reactor 80.

Further, as shown in FIG. 8, the bus bar 194w as a measurement target of the electric current sensor 64w extends in the upper/lower direction of the vehicle 10. The other bus bars 164u, 164v, 164w, 194u, 194v also extend in the upper/lower direction of the vehicle 10. In this regard, the main surfaces of the bus bars 164, 194 are oriented in the left/right direction of the vehicle 10. As can be seen from the orientation of the Hall IC 210b in FIG. 8, the orientation of the magnetic flux $\phi$ detected by each of the electric current sensors 62, 64 is the front/rear direction of the vehicle 10. Stated otherwise, the magnetic field detection surface 252 of the Hall element 230 (FIG. 5) faces the front/rear direction of the vehicle 10. As described above, the output in correspondence with the intensity of the magnetic field B applied perpendicularly to the magnetic field detection surface 252 is outputted from the signal line 242 (FIG. 5).

A-3. Method of Setting the Gap Length G

<A-3-1. Overview of a Method of Setting the Gap Length G>

Next, a method of setting the gap length G (i.e., a method of producing the PCU 26) in the embodiment of the present invention will be described. In the embodiment, the following criteria are used to set the gap length G (G1, G2) for each of the cores 212a, 212b.

Criterion 1:

The gap length G is decreased as the orientation (representative direction) of the magnetic flux $\phi$ detected by the electric current sensors 62, 64 gets closer to the orientation of the magnetic flux $\phi$ generated by the reactor 80 (magnetic field generation source).

Criterion 2:

The gap length G is decreased as the direct distances d1, d2 between the electric current sensors 62, 64 and the reactor 80 get shorter.

Criterion 3:

The gap length G is decreased as the maximum design value of the electric current detected by the electric current sensors 62, 64 gets smaller.

The above direct distance d1 is the length connecting a central position Pc1 of the nearest coil axis (coil axis Ax1 herein) from the sensor 62 and the Hall element 230 of the sensor 62. The above direct distance d2 is the length connecting a central position Pc1 of the nearest coil axis (coil axis Ax1 herein) from the sensor 64 and the Hall element 230 of the sensor 64. Though the distances D1, D2 described later are limited to the axial direction of the reactor 80, it should be noted that the direct distances d1, d2 are three-dimensional distances.

As described later, the above criterion 1 can be replaced by the positional relationship among the electric current sensors 62, 64 and the reactor 80. In each of the above criteria 1 to 3, the setting range of the gap length G is determined beforehand, and in this range, the gap length G is changed.

[A-3-2. Criterion 1]

FIG. 9 is a plan view showing an example of a magnetic field (leakage magnetic flux $\phi l$) generated by the reactor 80 according to the embodiment of the present invention. In FIG. 9, a part of the reactor 80 (I-shaped cores 112a, 112b, etc.) is not shown. Also in the case where the I-shape cores 112a, 112b are included in FIG. 3, the magnetic field has the same orientation and distribution. As shown in FIG. 9, in the magnetic coupling type reactor 80, a magnetic field is generated around each of the first winding part 114a, the second winding part 114b, the third winding part 114c, and the fourth winding part 114d.

As described above, in the embodiment of the present invention, switching of the lower switching elements 82a, 82b and the upper switching elements 84a, 84b is performed to change the orientation of the magnetic field (magnetic flux $\phi l$). Therefore, it should be noted that the orientation of the magnetic field (magnetic flux $\phi l$) shown in FIG. 9 is an example (typical direction or representative direction).

As described above, according to the criterion 1 of the method of setting the gap length G, the gap length G is decreased as the orientation (representative direction) of the magnetic flux $\phi$ detected by the electric current sensors 62, 64 gets closer to the orientation of the magnetic flux $\phi$ generated by the reactor 80 (magnetic field generation source).

In the case where the orientation of the magnetic flux $\phi$ detected by the electric current sensors 62, 64 is close to the orientation of the magnetic flux $\phi$ generated by the reactor 80, the degree of the offset resulting from the leakage magnetic flux $\phi l$ becomes large. Therefore, the gap length G is decreased so as to improve the resistance (or the signal noise ratio (S/N ratio)) sufficiently to deal with the increase in this degree of the offset. In contrast, in the case where the orientation of the magnetic flux ϕ detected by the electric current sensors 62, 64 is far from the orientation of the leakage magnetic flux ϕl generated by the reactor 80, the influence due to the increase in the degree of the offset resulting from the leakage magnetic flux ϕl becomes small. Therefore, rather, in order to ensure the desired linearity in the output of the Hall element 230, or in order to ensure the sufficient magnetic field saturation density of the core 212, the gap length G is increased to some extent.

As described above, in the embodiment of the present invention, the Hall elements 230 (Hall ICs 210a, 210b) are used. Further, as shown in FIGS. 6 and 7, since the magnetic field detection surface 252 of the Hall element 230 is oriented in the front/rear direction of the vehicle 10, the orientation of the magnetic flux ϕ detected by the Hall element 230 is the front/rear direction of the vehicle 10.

As shown in FIG. 9, at the position of the GEN electric current sensor 64, the orientation of the magnetic flux ϕ detected by the Hall element 230 (direction perpendicular to the magnetic field detection surface 252) is close to the orientation of the leakage magnetic flux ϕl generated by the reactor 80. Therefore, in the GEN electric current sensor 64, the gap length G2 (FIG. 4B) of the core 212b is decreased.

In contrast, at the position of the TRC electric current sensor 62, the orientation of the magnetic flux ϕ detected by the Hall element 230 (direction perpendicular to the magnetic field detection surface 252) is opposite to the orientation of the magnetic flux ϕ generated by the reactor 80. Stated otherwise, the leakage magnetic flux ϕl generated by the reactor 80 is closely parallel with the magnetic field detection surface 252. Therefore, in the TRC electric current sensor 62, the gap length G1 (FIG. 4A) of the core 212a is increased.

In the case where the following conditions 1 and 2 are satisfied, the criterion 1 can be replaced based on the distances D1 and D2 between the sensors 62, 64 and the reactor 80 (or the coupling coils 102a, 102b) in the axial direction of the reactor 80 (direction of the coil axes Ax1, Ax2).

Condition 1:
The orientation of the magnetic field detection surface 252 of the Hall element 230 is the same as the orientation of the coil axes Ax1, Ax2 (or substantially the same as the orientation of the coil axes Ax1, Ax2).

Condition 2:
In the direction perpendicular to the coil axes Ax1, Ax2 (e.g., in the left/right direction of the vehicle 10), the sensors 62, 64 are shifted from the reactor 80 (or the coupling coils 102a, 102b).

For example, in an example of FIG. 9, as the sensors 62, 64 get remoter from the reactor 80 (or the coupling coil 102a, 102b) in the direction of the coil axes Ax1, Ax2, the orientation of the leakage magnetic flux ϕl gets closer to parallel to the magnetic field detection surface 252 of the Hall element 230. Therefore, the criterion 1 can be replaced by the following criterion 1'.

Criterion 1':
The gap lengths G1, G2 are increased as the distances D1 and D2 between the electric current sensors 62, 64 and the reactor 80 (or the coupling coils 102a, 102b) in the direction of the coil axes Ax1, Ax2 get longer.

The above distance D1 is the length connecting the central position of the nearest winding part from the sensor 62 (third winding part 114c in the example of FIG. 9) and the Hall element 230 of the sensor 62, in the axial direction of the reactor 80 (direction of the coil axis Ax1) (see FIG. 9). The above distance D2 is the length connecting the central position of the nearest winding part from the sensor 64 (first winding part 114a in the example of FIG. 9) and the Hall element 230 of the sensor 64, in the axial direction of the reactor 80 (direction of the coil axis Ax1) (see FIG. 9).

In the embodiment of the present invention, each of the TRC electric current sensors 62 has the same gap length G1. However, the gap length G1 may be changed based on the criterion 1 (or the criterion 1'). Likewise, each of the GEN electric current sensors 64 has the same gap length G2. However, the gap length G2 may be changed based on the criterion 1 (or the criterion 1').

[A-3-3. Criterion 2]
As described above, according to the criterion 2 of the method of setting the gap length G, the gap lengths G1 and G2 are decreased as the direct distances d1, d2 between the electric current sensors 62, 64 (in particular, magnetic field detection surface 252) and the reactor 80 get shorter. As the direct distances d1, d2 get shorter, the influence of the magnetic field B generated by the reactor 80 becomes large. Therefore, the gap lengths G1 and G2 are decreased to reduce the influence.

As can be seen from FIGS. 6 and 7, etc. the direct distance d2 between the GEN electric current sensor 64 and the reactor 80 is shorter than the direct distance d1 between the TRC electric current sensor 62 and the reactor 80. Therefore, in the GEN electric current sensor 64, the gap length G2 of the core 212b is decreased, and in the TRC electric current sensor 62, the gap length G1 of the core 212a is increased (see FIGS. 4A and 4B).

In the embodiment of the present invention, the gap length G1 of each of the TRC electric current sensors 62 has the same gap length G1. However, the gap length G1 may be changed based on the criterion 2. Likewise, the gap length G2 of each of the GEN electric current sensor 64 has the same gap length G2. However, the gap length G2 may be changed based on the criterion 2.

[A-3-4. Criterion 3]
As described above, according to the criterion 3 of the method of setting the gap lengths G1 and G2, the gap lengths G1 and G2 are increased as the maximum design value of the electric current detected by the electric current sensors 62, 64 gets larger. This criterion 3 takes the following points into account. As the gap lengths G1, G2 get larger, the range where the linearity in the output of the Hall element 230 satisfies the required level gets wider. Further, as the gap lengths G1, G2 get smaller, it becomes easy to reach the saturation magnetic flux density of the cores 212a, 212b. If the maximum design value of the electric current is small, it becomes difficult to reach the saturation magnetic flux density.

As described above, in the embodiment of the present invention, the converter 50 steps up the battery voltage Vbat, and supplies the stepped up voltage to the traction motor 20. As a result, the maximum design value of the input voltage to the traction motor 20 is higher than the maximum design value of the power generation voltage of the generator 22. Therefore, in the GEN electric current sensor 64, the gap length G2 of the core 212b is decreased, and in the TRC electric current sensor 62, the gap length G1 of the core 212a is increased.

In the embodiment of the present invention, the gap length G1 of each of the TRC electric current sensors 62 has the same gap length G1. However, the gap length G1 may be changed based on the criterion 3. Likewise, the gap length G2 of each of the GEN electric current sensors 64 has the same gap length G2. However, the gap length G2 may be changed based on the criterion 3.

[A-3-5. Summary]

Based on the above criteria 1 to 3 (in particular, criterion 1), in the embodiment of the present invention, as shown in FIGS. 4A and 4B, the gap length G2 of the GEN electric current sensor 64 is decreased, and the gap length G1 of the TRC current sensor 62 is increased.

A-4. Advantages of the Embodiment of the Present Invention

In the embodiment of the present invention, for the following reasons, it becomes possible to effectively utilize the gap lengths G1, G2 of the magnetic cores 212a, 212b having the gaps 260a, 260b for providing the Hall elements 230 which are influenced by the ambient magnetic field.

That is, in the embodiment of the present invention, the TRC electric current sensor 62 (first electric current sensor) and the GEN electric current sensor 64 (second electric current sensor) detect the electric currents It, Ig of the bus bars 164u, 164v, 164w (first electric power lines) and the bus bars 194u, 194v, 194w (second electric power lines) extending on a lateral side of the reactor 80. Therefore, the TRC electric current sensor 62 (first electric current sensor) and the GEN electric current sensor 64 (second electric current sensor) are provided at positions relatively close to the reactor 80, and influenced by the leakage magnetic flux φ1 from the reactor 80 (FIG. 9, etc.). The leakage magnetic flux φ1 of the reactor 80 tends to be generated in a direction concentric with the reactor 80, or in a direction nearly concentric with the reactor 80.

The bus bars 164u, 164v, 164w, and the bus bars 194u, 194v, 194w are provided in a direction (upper/lower direction of the vehicle 10) perpendicular to the coil axes Ax1, Ax2 (or the axial direction of the reactor 80, or the front/rear direction of the vehicle 10) (see FIGS. 6 to 8). In the structure, the intensity of the magnetic field generated by the electric current It flowing through the bus bars 164u, 164v, 164w is detected by the Hall element 230 (first detection element) of the TRC electric current sensor 62 (first electric current sensor). As a result, in the case of detecting the electric current It (first electric current) by the sensor 62, the direction of the magnetic field detected by the Hall element 230 (detected magnetic field direction) may become close to the direction of the leakage magnetic flux φ1 of the reactor 80. This principle is applicable to the GEN electric current sensor 64 (second electric current sensor) as well.

In the embodiment of the present invention, in the direction of the coil axes Ax1, Ax2, the distance D2 between the Hall element 230 of the GEN electric current sensor 64 and the central position of the first winding part 114a is shorter than the distance D1 between the TRC electric current sensor 62 and the central position of the third winding part 114c (FIG. 9, etc.). Further, the gap length G2 of the GEN electric current sensor 64 (the second gap length) is smaller than the gap length G1 of the TRC electric current sensor 62 (first gap length) (FIGS. 4A and 4B).

Therefore, in the case where the influence of the leakage magnetic flux φ1 generated by the reactor 80 is large for the GEN electric current sensor 64, the gap length G2 for the GEN electric current sensor 64 is decreased to make it easy to detect the magnetic flux φ (magnetic flux which should be detected basically) generated in the core 212b in correspondence with the electric current Ig in the bus bars 194u, 194v, 194w. Therefore, it becomes possible to decrease variation in the sensitivity of the electric current Ig due to the leakage magnetic flux φ1 from the reactor 80. Thus, it becomes possible to improve the tolerance of the GEN electric current sensor 64 against the leakage magnetic flux φ1 from the reactor 80.

Further, in the case where the influence of the magnetic flux φ1 generated by the reactor 80 is small for the TRC electric current sensor 62, the gap length G1 for the TRC electric current sensor 62 is increased to reduce the influence of the magnetic flux φ (magnetic flux which should be detected basically) generated in the core 212a in correspondence with the electric current It (first electric current) in the bus bar 164. In this manner, it becomes possible to suppress the influence on the linearity of the TRC electric current sensor 62, or saturation of the magnetic flux φ of the core 212a. In particular, such effects are advantageous in the case where the maximum value of the electric current It (first electric current) is larger than the maximum value of the electric current Ig (second electric current). Further, such effects are suitable in the case where the Hall element 230 of the sensor 62 and the Hall element 230 of the sensor 64 have structure according to the same specification.

In the embodiment of the present invention, the TRC electric current sensor 62 (first electric current sensor) and the GEN electric current sensor 64 (second electric current sensor) have the Hall elements 230 as the detection elements (FIG. 5). The magnetic field detection surface 252 of the Hall element 230 of the TRC electric current sensor 62 is provided at an angle whereby the magnetic field detection surface 252 of the Hall element 230 of the TRC electric current sensor 62 is more closely parallel to the orientation of the magnetic flux φ generated by the reactor 80 than the magnetic field detection surface 252 of the Hall element 230 of the GEN electric current sensor 64 (FIG. 9).

In the embodiment of the present invention, the magnetic field detection surface 252 of the TRC electric current sensor 62 is provided at an angle whereby the magnetic field detection surface 252 of the TRC electric current sensor 62 is more closely parallel to the orientation of the magnetic flux φ generated by the reactor 80 than the magnetic field detection surface 252 of the GEN electric current sensor 64, and the first gap length G is smaller than the second gap length G. Therefore, the GEN electric current sensor 64 can be influenced easily by the magnetic flux φ (magnetic flux which should be detected basically) generated in the core 212b (second core) in correspondence with the electric current Ig (second electric current) in the bus bar 194 (second electric line), and variation in the sensitivity of the electric current Ig due to the leakage magnetic flux φ1 is reduced. As a result, influence of the leakage magnetic flux φ1 from the reactor 80 is suppressed relatively. Thus, it becomes possible to improve the resistance of the GEN electric current sensor 64 against the leakage magnetic flux φ1 from the reactor 80.

Further, as for the TRC electric current sensor 62 having the detected magnetic field direction remote from the direction of the magnetic flux φ generated by the reactor 80 (i.e., having small influence of the leakage magnetic flux φ1 from the reactor 80), the first gap length G1 is increased. Therefore, by suppressing influence of the magnetic flux φ (magnetic flux which should be detected basically) generated in the core 212a (first core) in correspondence with the electric current It (first electric current) in the bus bar 164 (first electric power line), on the TRC electric current sensor 62, it becomes possible to reduce the magnetic flux in correspondence with the DC component of the TRC electric current sensor 62, suppress the influence on the linearity of the TRC electric current sensor 62 or saturation of the magnetic flux φ of the core 212a.

In the embodiment of the present invention, the direct distance d2 (second direct distance) between the Hall element 230 (second detection element) of the GEN electric current sensor 64 and the reactor 80 is shorter than the direct distance d1 (first direct distance) between the Hall element 230 (first detection element) of the TRC electric current sensor 62 and the reactor 80. Therefore, even in the case where the GEN electric current sensor 64 having the detected magnetic field direction close to the orientation of the magnetic flux ϕ generated by the reactor 80 (i.e., having large influence of the leakage magnetic flux ϕl generated from the reactor 80) is provided close to the reactor 80 for reasons of design, by decreasing the gap length G2 (second gap length), it becomes possible to improve the resistance of the GEN electric current sensor 64 against the leakage magnetic flux ϕl from the reactor 80.

In the embodiment of the present invention, the reactor 80 is a magnetic coupling type reactor (FIGS. 1 to 3). Therefore, it becomes easy to provide the TRC electric current sensor 62 (first electric current sensor) and the GEN electric current sensor 64 (second electric current sensor) around the magnetic coupling type reactor having a variety of distributions in the orientation of the magnetic field in comparison with other types of reactors, and improve the freedom in design.

In the embodiment of the present invention, the Hall element 230 (first detection element) of the TRC electric current sensor 62 and the Hall element 230 (second detection element) of the GEN electric current sensor 64 have structure according to the same specification (FIGS. 4A and 4B). Therefore, while the influence of the leakage magnetic flux ϕl from the reactor 80 varies depending on the position, by adopting the common specification for the Hall elements 230, it becomes possible to reduce the cost of the Hall elements 230.

The outer diameter of the core 212a (first core) of the TRC electric current sensor 62 and the outer diameter of the core 212b (second core) of the GEN electric current sensor 64 are the same except the gaps 260a, 260b (first gap, second gap) (FIGS. 4A and 4B). In the structure, while the influence of the leakage magnetic flux ϕl from the reactor 80 varies depending on the position, by adopting the cores 212a, 212b having the same outer dimensions, it becomes possible to reduce the cost of the cores 212a, 212b.

B. Modified Embodiments

The present invention is not limited to the above described embodiment. It is a matter of course that various structures can be adopted based on the description of the specification. For example, the following structure can be adopted.

B-1. Target Applications

The vehicle 10 according to the above embodiment includes the traction motor 20, the generator 22 (FIG. 1), and the engine (not shown). However, for example, in terms of adopting the plurality of cores 212a, 212b having different gap lengths G1, G2, the present invention is not limited in this respect. For example, the vehicle 10 may have structure including a plurality of traction motors 20 and the generators 22.

B-2. Rotating Electric Machine

In the embodiment of the present invention, the traction motor 20 and the generator 22 adopt a three-phase AC brushless type (FIG. 1). However, for example, in terms of adopting the plurality of cores 212a, 212b having different gap lengths G1, G2, the present invention is not limited in this respect. The traction motor 20 and the generator 22 may adopt a DC type or a brush type.

B-3. Reactor 80

In the above embodiment, the reactor 80 is a magnetic coupling type reactor (FIGS. 1 to 3). However, for example, in terms of adopting the plurality of cores 212a, 212b having different gap lengths G1, G2, the present invention is not limited in this respect. For example, the reactor 80 may adopt a type including only one coil (normal drive scheme) or may adopt a type including two coils arranged in parallel (interleave scheme), etc.

In the above embodiment, the reactor 80 has been taken as an example of the source of generating the magnetic field (FIG. 9). However, the present invention is applicable to other sources of generating the magnetic field as well.

B-4. Electric Current Sensors 62, 64

In the above embodiment, the gap lengths G (G1, G2) of the six electric current sensors 62u, 62v, 62w, 64u, 64v, 64w have been described (FIGS. 6 to 8, etc.). However, for example, in terms of adopting the plurality of cores 212a, 212b having different gap lengths G1, G2, the present invention is not limited in this respect. It is sufficient that the number of electric current sensors is two. For example, the number of electric current sensors may be any of two to fifty (2 to 50). Further, for failsafe purpose, etc., it may be possible to provide two electric current sensors 62u for the same bus bars 164, 194 (e.g., bus bar 164u).

The sensors 62, 64 of the above embodiment include the Hall elements 230 (Hall ICs 210a, 210b) (FIG. 5). However, for example, in terms of adopting the plurality of cores 212a, 212b having different gap lengths G1, G2, the present invention is not limited to these types of the sensors 62, 64. For example, the present invention is applicable to the magnetic sensor other than the Hall elements 230 (Hall ICs 210a, 210b) or other sensors.

In the above embodiment, the sensors 62u, 62v, 62w, 64u, 64v, 64w are arranged in one line in the front/rear direction (FIGS. 6 and 7). However, for example, in terms of adopting the plurality of cores 212a, 212b having different gap lengths G1, G2, the present invention is not limited in this respect.

In the above embodiment, the cores 212a, 212b of the sensors 62u, 62v, 62w, 64u, 64v, 64w are oriented in the same direction (FIG. 7, etc.). However, for example, in terms of adopting the plurality of cores 212a, 212b having different gap lengths G1, G2, the present invention is not limited in this respect. For example, in the above embodiment, in a plan view, though the gaps 260a, 260b are provided on a side of the cores 212a, 212b closer to the reactor 80 (FIGS. 6 to 8), the gaps 260a, 260b may be provided at other positions.

In the above embodiment, in FIG. 4A, the Hall IC 210a and the gap 260a are positioned below the core 212a. Alternatively, without changing the position of the reactor 80, the Hall IC 210a and the gap 260a may be provided on the left side of the core 212a. In the case where the magnetic field detection surface 252 of the Hall element 230 is provided with clockwise rotation by 90° from the example of FIG. 4A, the direction in which the magnetic field detection surface 252 of the Hall element 230 is oriented (magnetic flux detection direction) is nearly perpendicular to the orientation of the leakage magnetic flux φ1. In this case, the gap length G1 of the core 212a may be decreased.

What is claimed is:

1. An electric power device comprising:
   a reactor including a winding part;
   a first electric power line and a second electric power line extending on a lateral side of the reactor in a direction perpendicular to an axial direction of the reactor;
   a first electric current sensor including a first detection element and an annular first core with a first gap for providing the first detection element, and being configured to detect first electric current flowing through the first electric power line;
   a second electric current sensor including a second detection element and an annular second core with a second gap for providing the second detection element, and being configured to detect second electric current flowing through the second electric power line; and
   an electric circuit configured to make a maximum value of the first electric current larger than a maximum value of the second electric current,
   wherein a normal direction of a magnetic field detection surface of the first detection element and a normal direction of a magnetic field detection surface of the second detection element extend along the axial direction of the reactor,
   the first detection element and the second detection element are deviated from the reactor in a direction intersecting the axial direction of the reactor, and
   wherein, in the axial direction of the reactor, a distance between the second detection element and a central position of the winding part is smaller than a distance between the first detection element and the central position of the winding part; and
   a second gap length as a length of the second gap is smaller than a first gap length as a length of the first gap.

2. An electric power device comprising,
   a reactor including a winding part;
   a first electric power line and a second electric power line extending on a lateral side of the reactor in a direction perpendicular to an axial direction of the reactor;
   a first electric current sensor including a first detection element and an annular first core with a first gap for providing the first detection element, and being configured to detect first electric current flowing through the first electric power line;
   a second electric current sensor including a second detection element and an annular second core with a second gap for providing the second detection element, and being configured to detect second electric current flowing through the second electric power line; and
   an electric circuit configured to make a maximum value of the first electric current larger than a maximum value of the second electric current,
   wherein, in the axial direction of the reactor, a distance between the second detection element and a central position of the winding part is smaller than a distance between the first detection element and the central position of the winding part; and
   a second gap length as a length of the second gap is smaller than a first gap length as a length of the first gap,
   wherein the first detection element is a first Hall element;
   the second detection element is a second Hall element; and
   a magnetic field detection surface of the first Hall element is provided at an angle whereby the magnetic field detection surface of the first Hall element is more closely parallel to an orientation of leakage magnetic flux generated by the reactor than a magnetic field detection surface of the second Hall element.

3. The electric power device according to claim 1, wherein a second direct distance between the second detection element and the reactor is smaller than a first direct distance between the first detection element and the reactor.

4. The electric power device according to claim 1, wherein the reactor is a magnetic coupling type reactor.

5. The electric power device according to claim 1, wherein the first detection element and the second detection element have structure according to same specification.

6. The electric power device according to claim 1, wherein an outer diameter of the first core and an outer diameter of the second core are a same diameter.

7. A method of producing an electric power device, the electric power device comprising:
   a reactor including a winding part;
   a first electric current sensor including a first detection element and an annular first core with a first gap for providing the first detection element, and being configured to detect first electric current flowing through a first electric power line; and
   a second electric current sensor including a second detection element and an annular second core with a second gap for providing the second detection element, and being configured to detect second electric current flowing through a second electric power line,
   the method comprising the steps of:
   arranging the first detection element, the second detection element, and the reactor in a manner that a magnetic flux detection direction as a direction of magnetic flux detected by the first detection element and the second detection element and an axial direction of the reactor become same, the first detection element and the second first detection element are deviated from the reactor in a direction intersecting the axial direction of the reactor, and in the axial direction of the reactor, a distance between the second detection element and a central position of the winding part becomes smaller than a distance between the first detection element and the central position of the winding part; and
   making a second gap length as a length of the second gap smaller than a first gap length as a length of the first gap.

8. The electric power device according to claim 2, wherein a second direct distance between the second detection element and the reactor is smaller than a first direct distance between the first detection element and the reactor.

9. The electric power device according to claim 2, wherein the reactor is a magnetic coupling type reactor.

10. The electric power device according to claim 2, wherein the first detection element and the second detection element have structure according to same specification.

11. The electric power device according to claim 2, wherein an outer diameter of the first core and an outer diameter of the second core are a same diameter.

* * * * *